(12) United States Patent
Torng et al.

(10) Patent No.: US 10,534,996 B2
(45) Date of Patent: **\*Jan. 14, 2020**

(54) MEMORY SUBSYSTEM IN CNN BASED DIGITAL IC FOR ARTIFICIAL INTELLIGENCE

(71) Applicant: GYRFALCON TECHNOLOGY INC., Milpitas, CA (US)

(72) Inventors: Chyu-Jiuh Torng, Dublin, CA (US); Daniel Liu, San Jose, CA (US)

(73) Assignee: Gyrfalcon Technology Inc., Milpitas, CA (US)

( * ) Notice: Subject to any disclaimer, the term of this patent is extended or adjusted under 35 U.S.C. 154(b) by 228 days.

This patent is subject to a terminal disclaimer.

(21) Appl. No.: 15/729,615

(22) Filed: Oct. 10, 2017

(65) Prior Publication Data

US 2018/0285722 A1    Oct. 4, 2018

Related U.S. Application Data

(63) Continuation-in-part of application No. 15/591,069, filed on May 9, 2017, now Pat. No. 10,331,368, and
(Continued)

(51) Int. Cl.
*G06N 3/063*     (2006.01)
*G11C 11/16*    (2006.01)
(Continued)

(52) U.S. Cl.
CPC ............ *G06N 3/063* (2013.01); *G11C 11/005* (2013.01); *G11C 11/161* (2013.01);
(Continued)

(58) Field of Classification Search
CPC ...... G06F 3/0629; G06F 3/0688; G06F 3/061; G06F 13/4068; G06F 13/16; G06N 3/04; G11C 11/161

See application file for complete search history.

(56) References Cited

U.S. PATENT DOCUMENTS 5,355,528 A * 10/1994 Roska .................. G06N 3/0635
706/38
5,717,834 A    2/1998 Werblin et al.
(Continued)

OTHER PUBLICATIONS

USPTO office action for U.S. Appl. No. 15/632,203 (Related case) dated Sep. 20, 2018.
(Continued)

*Primary Examiner* — Khamdan N. Alrobaie

(57) ABSTRACT

CNN (Cellular Neural Networks or Cellular Nonlinear Networks) based digital Integrated Circuit for artificial intelligence contains multiple CNN processing units. Each CNN processing unit contains CNN logic circuits operatively coupling to a memory subsystem having first and second memories. The first memory contains magnetic random access memory (MRAM) cells for storing weights (e.g., filter coefficients) while the second memory is for storing input signals (e.g., imagery data). The first memory may store one-time-programming weights or filter coefficients. The memory subsystem may contain a third memory that contains MRAM cells for storing one-time-programming data for security purpose. The second memory contains MRAM cells or static random access memory cells. Each MRAM cell contains a voltage-controlled magnetic anisotropy (VCMA) based magnetic tunnel junction (MTJ) element. Magnetization direction in VCMA based MTJ element can be in-plane or out-of-plane.

20 Claims, 6 Drawing Sheets

Related U.S. Application Data a continuation-in-part of application No. 15/498,378, filed on Apr. 26, 2017, and a continuation-in-part of application No. 15/477,263, filed on Apr. 3, 2017, now Pat. No. 10,331,367.

(51) Int. Cl.
  *G11C 17/16* (2006.01)
  *G11C 11/00* (2006.01)
  *G11C 11/54* (2006.01)

(52) U.S. Cl.
  CPC .......... *G11C 11/1675* (2013.01); *G11C 11/54* (2013.01); *G11C 17/16* (2013.01)

(56) References Cited

U.S. PATENT DOCUMENTS

| | | | |
|---|---|---|---|
| 7,884,433 B2 | 2/2011 | Zhong et al. | |
| 8,183,061 B2 | 5/2012 | Zhong et al. | |
| 8,324,698 B2 | 12/2012 | Zhong et al. | |
| 8,772,051 B1 | 7/2014 | Zhong et al. | |
| 8,803,293 B2 | 8/2014 | Zhong et al. | |
| 8,933,542 B2 | 1/2015 | Zhong et al. | |
| 9,111,222 B2 * | 8/2015 | Aparin | G06N 3/0472 |
| 9,166,143 B1 | 10/2015 | Gan et al. | |
| 9,437,272 B1 | 9/2016 | Lu et al. | |
| 9,673,388 B2 | 6/2017 | Toh et al. | |
| 9,685,604 B2 | 6/2017 | Huang et al. | |
| 9,734,880 B1 | 8/2017 | Augustine et al. | |
| 9,767,557 B1 | 9/2017 | Gulsun et al. | |
| 9,940,534 B1 | 4/2018 | Yang et al. | |
| 9,959,500 B1 | 5/2018 | Torng et al. | |
| 10,049,322 B2 | 8/2018 | Ross | |
| 2007/0047294 A1 | 3/2007 | Panchula | |
| 2011/0273926 A1 * | 11/2011 | Wu | G11C 11/16 365/158 |
| 2012/0294076 A1 | 11/2012 | Lee et al. | |
| 2012/0294078 A1 | 11/2012 | Kent et al. | |
| 2014/0071741 A1 * | 3/2014 | Kim | G11C 11/16 365/158 |
| 2014/0177327 A1 * | 6/2014 | Khalili Amiri | G11C 11/161 365/158 |
| 2017/0039472 A1 | 2/2017 | Kudo | |
| 2017/0083813 A1 * | 3/2017 | Augustine | G06N 3/049 |
| 2017/0103298 A1 | 4/2017 | Liang et al. | |
| 2017/0103299 A1 | 4/2017 | Aydonat et al. | |
| 2018/0137414 A1 | 5/2018 | Du et al. | |
| 2018/0315473 A1 | 11/2018 | Jung et al. | |

OTHER PUBLICATIONS

Zhao et al. "Design of MRAM based Logic Circuits and its Applications", Proceeding GLSVLSI '11 Proceedings of the 21st edition of the great lakes symposium on Great lakes symposium on VLSI pp. 431-436 Lausanne, Switzerland—May 2-4, 2011.

Kodzuka et al. "Effects of boron composition on tunneling magnetoresistance ratio and microstructure of CoFeB/MgO/CoFeB pseudo-spin-valve magnetic tunnel junctions", Journal of Applied Physics 111, 043913 (2012).

Sze et al. "Hardware for Machine Learning: Challenges and Opportunities", Published at an invited conference paper at CICC 2017, Submitted on Dec. 22, 2016 (v1).

L. Thomas et al. "Basic Principles, Challenges and Opportunities of STT-MRAM for Embedded Memory Applications" MSST 2017—Santa Clara, May 17, 2017.

Kultursay et al. "Evaluating STT-RAM as an Energy-Efficient Main Memory Alternative", Published in: Performance Analysis of Systems and Software (ISPASS), 2013 IEEE International Symposium, Apr. 21-23, 2013.

Kang Wang et al. "Voltage-Controlled MRAM for Working Memory: Perspectives and Challenges", pp. 542-547, Mar. 2017, https://www.researchgate.net/publication/315665593.

Pedram Khalili Amiri et al. "Voltage-Controlled Magnetic Anisotropy in Spintronic Devices", Spin vol. 2, No. 3 (2012) 1240002 (9 pages), World Scientific Publishing Company.

Wang et al. "Comparative Evaluation of Spin-Transfer-Torque and Magnetoelectric Random Access Memory", 2015 IEEE.

Alzate et al. "Voltage-Induced Switching of Nanoscale Magnetic Tunnel Junctions", 2012 IEEE.

USPTO notice of allowance for U.S. Appl. No. 15/632,203 (related case) dated Mar. 25, 2019.

USPTO office action for U.S. Appl. No. 15/477,263 (Parent case) dated Sep. 7, 2018.

USPTO office action for U.S. Appl. No. 15/591,069 (Parent case) dated Sep. 7, 2018.

USPTO office action for U.S. Appl. No. 15/632,203 (related case) dated Feb. 26, 2019.

USPTO notice of allowance for U.S. Appl. No. 15/477,263 (parent case) dated Mar. 11, 2019.

USPTO notice of allowance for U.S. Appl. No. 15/591,069 (parent case) dated Mar. 14, 2019.

\* cited by examiner

US 10,534,996 B2

MEMORY SUBSYSTEM IN CNN BASED DIGITAL IC FOR ARTIFICIAL INTELLIGENCE

CROSS-REFERENCE TO RELATED APPLICATIONS

This application is a continuation-in-part (CIP) of a co-pending U.S. patent application Ser. No. 15/477,263, entitled "Embedded Memory Subsystems For A CNN Based Processing Unit And Methods Of Making" filed on Apr. 3, 2017. This application is also a CIP of a co-pending U.S. patent application Ser. No. 15/498,378, entitled "Buffer Memory Architecture For A CNN Based Processing Unit And Creation Methods Thereof" filed on Apr. 26, 2017. This application is also a CIP of a co-pending U.S. patent application Ser. No. 15/591,069, entitled "MLC BASED MAGNETIC RANDOM ACCESS MEMORY USED IN CNN BASED DIGITAL IC FOR AI" filed on May 9, 2017. All of which are hereby incorporated by reference in their entirety for all purposes.

FIELD

The invention generally relates to the field of integrated circuit and more particularly to memory subsystem in CNN based digital Integrated Circuit (IC) for Artificial Intelligence (AI).

BACKGROUND

Artificial Intelligence (AI) is defined as intelligence exhibited by machines (e.g., computers, processors, etc.). Intelligence means the ability to acquire and apply knowledge and skills. Many different approaches have been tried and tested in AI research since 1960s. One of the more promising techniques is based on Cellular Neural Networks or Cellular Nonlinear Networks (CNN). CNN have been applied to many different fields and problems including, but limited to, image processing, speech recognition, etc. However, most of the prior art CNN approaches are either based on software solutions (e.g., Convolutional Neural Networks, Recurrent Neural Networks, etc.) or based on hardware that are designed for other purposes (e.g., graphic processing, general computation, etc.). As a result, CNN prior approaches are too slow in term of computational speed and/or too expensive thereby impractical for processing large amount of imagery data. The imagery data can be from any two-dimensional signals (e.g., a still photo, a picture, a frame of a video stream, etc.).

For a CNN based IC for artificial intelligence, data must be provided as close to the CNN processing logic. In addition, different characteristics of data may be required. For example, in image processing, filter coefficients and imagery data have different requirements. Filter coefficients need to be validly stored for long time, while the imagery data are written and read more often.

SUMMARY

This section is for the purpose of summarizing some aspects of the invention and to briefly introduce some preferred embodiments. Simplifications or omissions in this section as well as in the abstract and the title herein may be made to avoid obscuring the purpose of the section. Such simplifications or omissions are not intended to limit the scope of the invention.

For a CNN processing unit for either mobile co-processor or servo co-processor for processing large amount of input signals (e.g., imagery data, voice data, etc.) Processing-in memory or memory-in processor is the most promising approach. Together with low power consumption, read/write speed and highly distributed on the same silicon are the three major requirements.

According to one aspect, CNN (Cellular Neural Networks or Cellular Nonlinear Networks) based digital Integrated Circuit for artificial intelligence contains multiple CNN processing units. Each CNN processing unit contains CNN logic circuits operatively coupling to a memory subsystem having first and second memories. The first memory contains magnetic random access memory (MRAM) cells for storing weights (e.g., filter coefficients) while the second memory is for storing input signals (e.g., imagery data). The first memory may store one-time-programming weights or filter coefficients. The memory subsystem may also include a third memory that contains MRAM cells for storing one-time-programming data for security purpose. The second memory contains MRAM cells or static random access memory cells. Each MRAM cell contains a voltage-controlled magnetic anisotropy (VCMA) based magnetic tunnel junction (MTJ) element. Magnetization direction in VCMA based MTJ element can be in-plane or out-of-plane.

Objects, features, and advantages of the invention will become apparent upon examining the following detailed description of an embodiment thereof, taken in conjunction with the attached drawings.

BRIEF DESCRIPTION OF THE DRAWINGS

These and other features, aspects, and advantages of the invention will be better understood with regard to the following description, appended claims, and accompanying drawings as follows:

DETAILED DESCRIPTIONS

In the following description, numerous specific details are set forth in order to provide a thorough understanding of the invention. However, it will become obvious to those skilled in the art that the invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or circuits representing one or more embodiments of the invention do not inherently indicate any particular order nor imply any limitations in the invention. Used herein, the terms "top", "bottom", "upper", "lower", "vertical", "horizontal", "planar", "parallel", "anti-parallel", "perpendicular", "plan", "elevation" are intended to provide relative positions for the purposes of description, and are not intended to designate an absolute frame of reference. Additionally, term "MTJ element" and "MTJ bit" are interchangeable.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Embodiments of the invention are discussed herein with reference to FIGS. 1-7. However, those skilled in the art will readily appreciate that the detailed description given herein with respect to these figures is for explanatory purposes as the invention extends beyond these limited embodiments.

Figure 1:
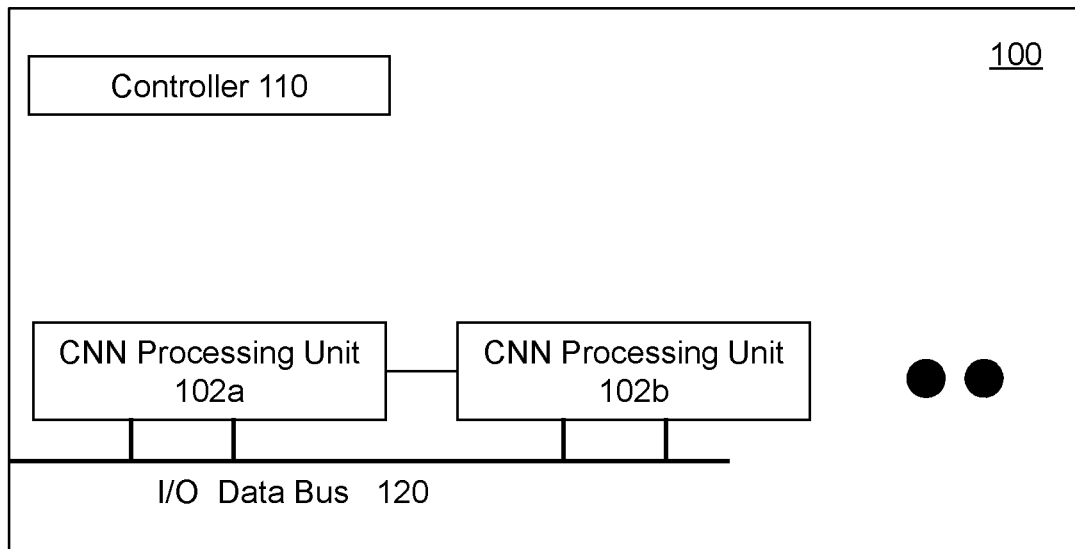
FIG. 1 is a block diagram illustrating an example CNN based IC for artificial intelligence in accordance with one embodiment of the invention.

Referring first to FIG. 1, it is shown a block diagram illustrating an example CNN based digital integrated circuit (IC) for artificial intelligence 100 for artificial intelligence (e.g., image processing, voice reorganization, etc.) in accordance with one embodiment of the invention.

The IC 100 is implemented as a digital semi-conductor chip (e.g., a silicon substrate) and contains a controller 110, and a plurality of CNN processing units 102a-102b operatively coupled to at least one input/output (I/O) data bus 120. Controller 110 is configured to control various operations of the CNN processing units 102a-102b, which are connected in a loop with a clock-skew circuit (e.g., D flip-flop).

In one embodiment, the digital integrated circuit 100 is extendable and scalable. For example, multiple copy of the digital integrated circuit 100 can be implemented on a single semi-conductor chip.

Figure 2A:
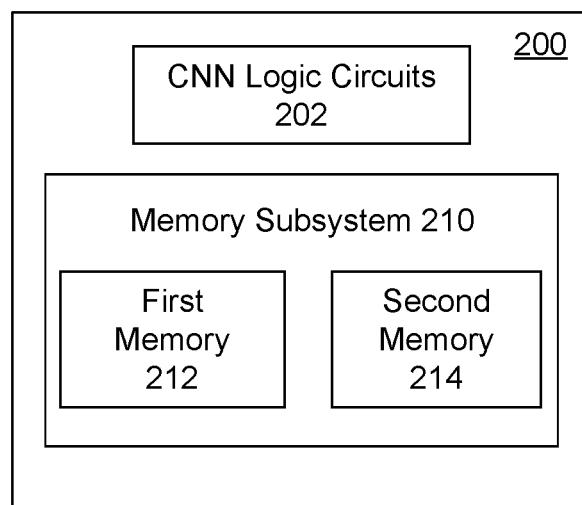
FIG. 2A is a function block diagram showing an example CNN processing unit including a first example memory subsystem according to an embodiment of the invention.
Figure 2B:
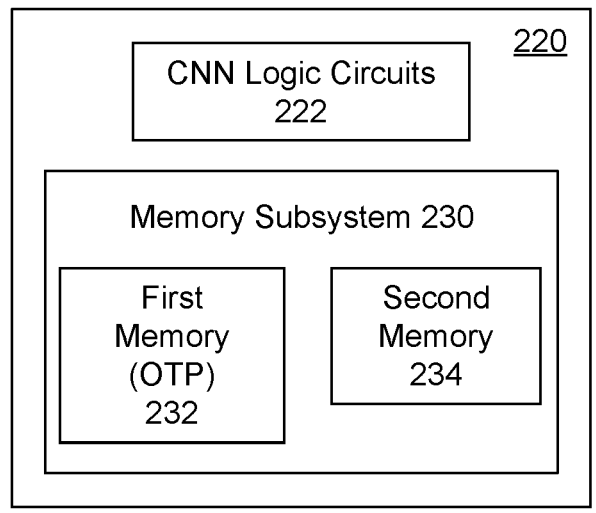
FIG. 2B is a function block diagram showing another example CNN processing unit including a second example memory subsystem according to an embodiment of the invention.

All of the CNN processing units are identical. For illustrating simplicity, function block diagram of an example CNN processing unit 200 is shown in FIG. 2A. The invention sets no limit to the number of CNN processing units on a digital semi-conductor chip.

Each CNN processing unit 200 contains CNN logic circuits 202, which is operatively coupled to an embedded memory subsystem 210. In other words, the memories of the embedded memory subsystem 210 and the CNN logic circuits 202 are located on the same digital semi-conductor chip. In one embodiment, CNN logic circuits 202 are for performing convolution operations of input signals with filter coefficients (or weights). In one embodiment, the input signals are imagery data. In another embodiment, the input signals are converted voice data.

Memory subsystem 210 is made of a first memory 212 and a second memory 214. The first memory 212 is for requiring data being stored with higher retention rate than the second memory 214. The second memory 214 is for facilitating higher endurance of balanced data read and write operations than the first memory 212. In one embodiment, the first memory 212 is for storing weights (e.g., filter coefficients) while the second memory 214 is for storing input signals (e.g., imagery data in an image processing application).

In one embodiment, the first memory 212 contains a first group of magnetic random access memory (MRAM) cells. The second memory 214 contains a second group of magnetic random access memory cells. Each of the magnetic random access memory cells contains a voltage-controlled magnetic anisotropy (VCMA) based magnetic tunnel junction (MTJ) element.

Figure 3A:
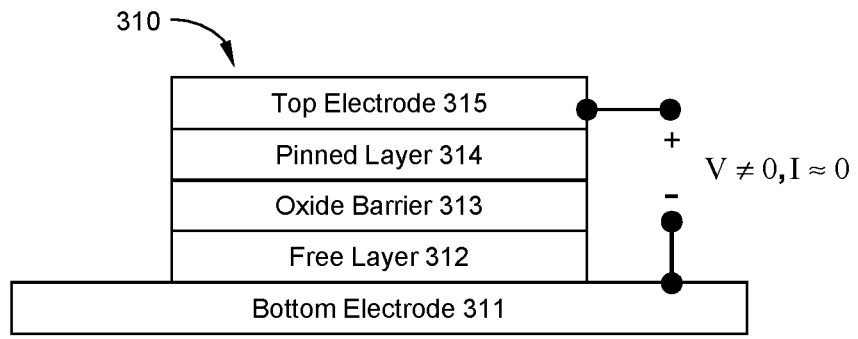
FIGS. 3A-3B are schematic diagrams showing various example structures of VCMA based MTJ element, according to an embodiment of the invention.

A schematic diagram of a first example VCMA based MTJ element 310 is shown in FIG. 3A. The first example VCMA based MTJ element 310 contains multiple layers as follows: bottom electrode 311, free layer 312, oxide barrier 313, pinned layer 314 and top electrode 315. The relative direction of magnetization of free layer 312 and pinned layer 314 gives two different states (i.e., zero and one) of the first example MTJ element 310. Magnetization direction in free layer 312 is switched by applying and then releasing a positive electric voltage pulse through the VCMA based MTJ element 310 between top electrode 315 and bottom electrode 311.

Figure 4A:
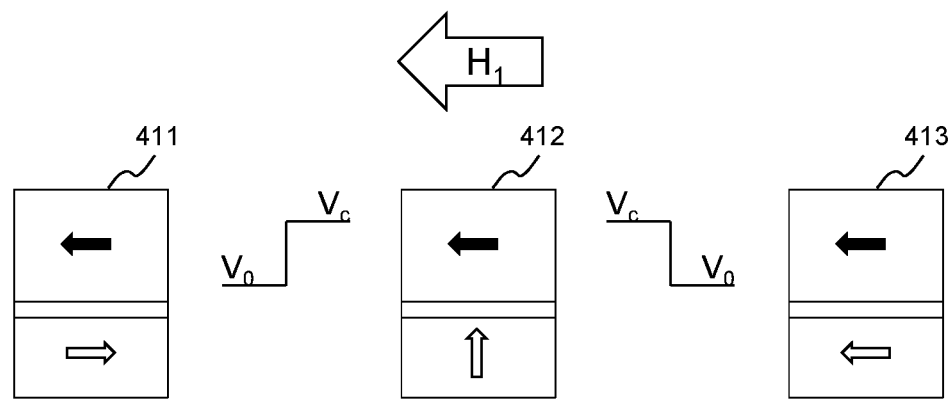
FIGS. 4A-4B are diagrams showing voltage-induced switching sequences of an example in-plane VCMA based MTJ element, according to an embodiment of the invention.
Figure 4B:
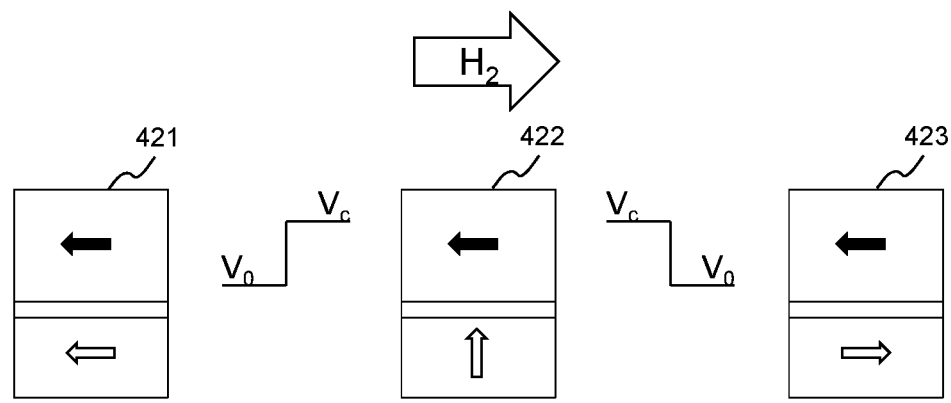

FIGS. 4A-4B are diagrams showing a sequence during switching of in-plane magnetization direction of the free layer. For illustration simplicity and clarity, only fixed layer and free layer with an oxide barrier are shown. The magnetization directions are shown as arrows. Solid arrow is for the fixed layer while the hollow arrow is for the free layer.

An in-plane VCMA based MTJ element starts at an anti-parallel (AP) state (i.e., two horizontal arrows are shown in opposite directions) 411, after an electric voltage pulse (i.e., critical voltage $V_c$) is applied, the magnetization direction of the free layer is switched to a meta-stable state 412. After the voltage pulse $V_c$ is removed back to $V_0$, the magnetization direction of the free layer is relaxed to a parallel (P) state 413 due to an externally applied magnetic field $H_1$. FIG. 4B is a diagram showing the magnetization direction of the free layer being switched from the P state to the AP state. Similar to the switching from AP to P, a voltage pulse $V_c$ is applied to an in-plane VCMA based MTJ element at the P state 421. The magnetization direction of the free layer is changed to a meta-stable state 422. After the voltage pulse $V_c$ is removed back to $V_0$, the magnetization direction of the free layer is relaxed to a parallel (AP) state 423 by an external magnetic field $H_2$. It is noted that $H_1$ and $H_2$ are opposite to each other.

Figure 6:
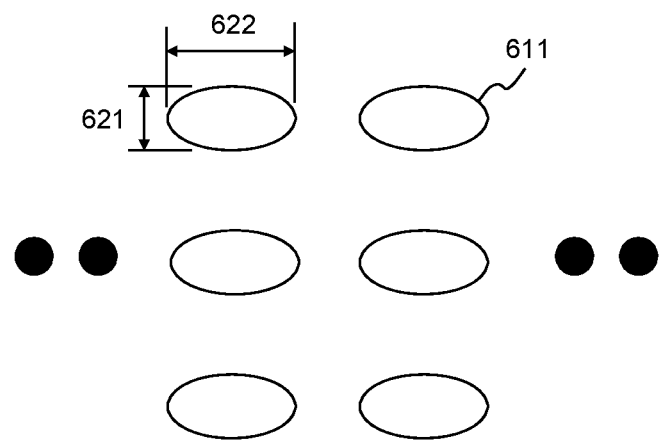
FIG. 6 is a plan view showing respective in-plane VCMA based MTJ elements of an example array of MRAM cells, according to an embodiment of the invention.

FIG. 6 shows an elliptical or oval planar shape 611 of respective in-plane VCMA based MTJ elements of an array of MRAM cells. The first group of MRAM cells of the first memory 212 and the second group of MRAM cells of the second memory 214 can be arranged with the same pitch or different pitch.

An in-plane VCMA based MTJ element of the first memory 212 can have a range of 40-120 nm (nanometer) for the minor-dimension 621 and 120-360 nm for the major-dimension 622. The dimension range for the second memory 214 is 30-80 nm for the minor-dimension 621 and 90-240 nm for the major-dimension 622. In general, it is easier to fabricate a larger size VCMA based MTJ elements than a smaller size ones. For example, it is easier to fabricate a 60×170 nm (i.e., minor-dimension×major-dimension) VCMA based MTJ element than a 30×75 nm one.

Figure 5A:
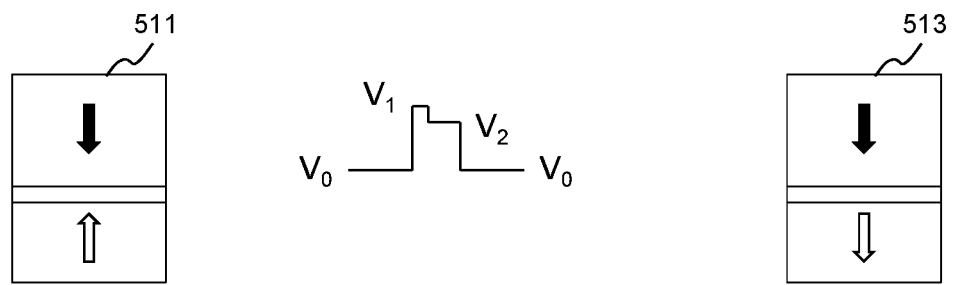
FIGS. 5A-5B are diagrams showing voltage-induced switching sequences of an example out-of-plane VCMA based MTJ element, according to an embodiment of the invention.
Figure 5B:
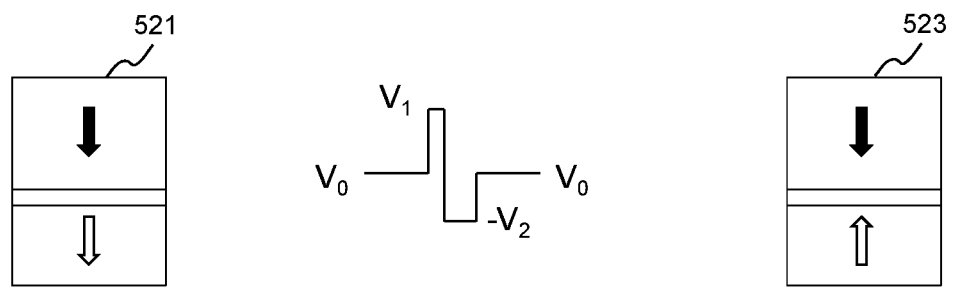

For an example out-of-plane VCMA based MTJ element, sequences of switching magnetization direction of the free layer are shown in FIGS. 5A-5B. Magnetization direction of the fixed layer is shown as a solid arrow, while the magnetization direction of the free layer is shown as a hollow arrow.

First, the out-of-plane VCMA based MTJ element starts in an anti-parallel (AP) state 511. A so-called Spin-Transfer Torque (STT) assisted VCMA strategy containing two consecutive voltage pulses ($V_1$ and $V_2$) is applied to switch the magnetization direction of the free layer. After both voltage pulses have been applied and removed, the AP state 511 is switched to a parallel (P) state 513. For opposite switching (i.e., P to AP), the out-of-plane VCMA based MTJ element starts in a P state 521. Two consecutive voltage pulses are applied: $V_1$ and a negative $V_2$. After two pulses have been applied and removed back to $V_0$, the magnetization direction of the free layer is switched to the AP state 523. It is noted that $V_1$ is larger than $V_2$. In order to switch the magnetization direction of the free layer in both directions, the second voltage pulse $V_2$ is applied in either positive or negative amount.

Figure 7:
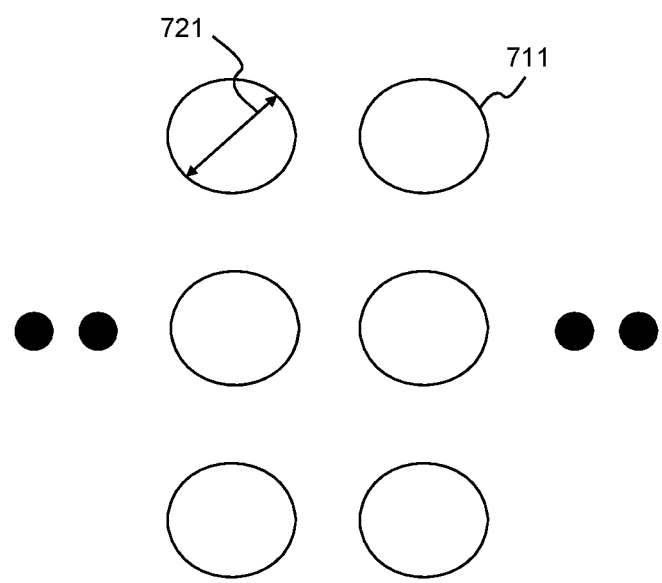
FIG. 7 is a plan view showing respective out-of-plane VCMA based MTJ elements of an example array of MRAM cells, according to an embodiment of the invention.

FIG. 7 shows a circular planar shape 711 of respective out-of-plane VCMA based MTJ elements of an array of MRAM cells. Similarly, the first group of MRAM cells of the first memory 212 and the second group of MRAM cells of the second memory 214 can be arranged with the same pitch or different pitch.

An out-of-plane VCMA based MTJ element of the first memory 212 can have a range of 40-120 nm in diameter 721. The dimension range for the second memory 214 is 30-80 nm in diameter 721. In general, it is easier to fabricate a larger size VCMA based MTJ elements than a smaller size ones.

Figure 3B:
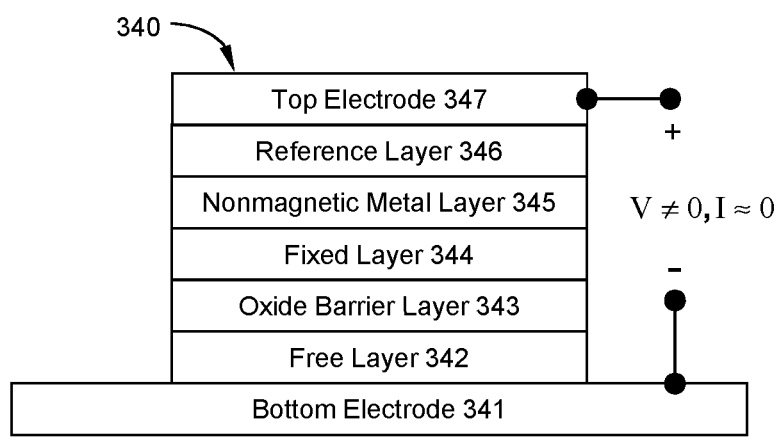

The schematic diagram in FIG. 3A shows an example structure of VCMA based MTJ element. There can be other structures to achieve the same, for example, an alternative example VCMA based MTJ element 340 is shown in FIG. 3B. The second example VCMA based MTJ element 340 also contains multiple layers: bottom electrode 341, free layer 342, oxide barrier layer 343, fixed or pinned layer 344, nonmagnetic metal layer 345, reference layer 346 and top electrode 347. The relative direction of magnetization of free layer 342 and fixed layer 344 gives two different states (i.e., zero and one) of the second example MTJ element 340.

Furthermore, the order of the example VCMA based MTJ elements 310, 340 can be reversed to achieve the same purpose.

In another embodiment, the first memory 212 contains a group of magnetic random access memory (MRAM) cells. The second memory 214 contains a group of static random access memory (SRAM) cells. Each of the magnetic random access memory cells contains a voltage-controlled magnetic anisotropy (VCMA) based magnetic tunnel junction (MTJ) element.

Referring back to FIG. 2B, it is shown another example CNN processing unit 220, which contains CNN logic circuits 222 operatively coupling to a memory subsystem 230. The memory subsystem 230 includes first memory 232 and second memory 234. The first memory 232 is for storing one-time-programming (OTP) filter coefficients or weights that are stored once and never changed. In other words, one specific set of filters are stored in the memory subsystem of respective CNN processing units of a CNN based digital IC for AI, which is designed for performing one specific task (e.g., extracting a particular feature of an image such as traffic signal recognition, lane keeping, etc.). The second memory 234 is for storing imagery data, which requires frequent read/write operations.

In one embodiment, both first and second memories 232-234 are made of MRAM cells with VCMA based MTJ elements. In another embodiment, the second memory 234 contains a number of SRAM cells instead of MRAM cells.

Figure 2C:
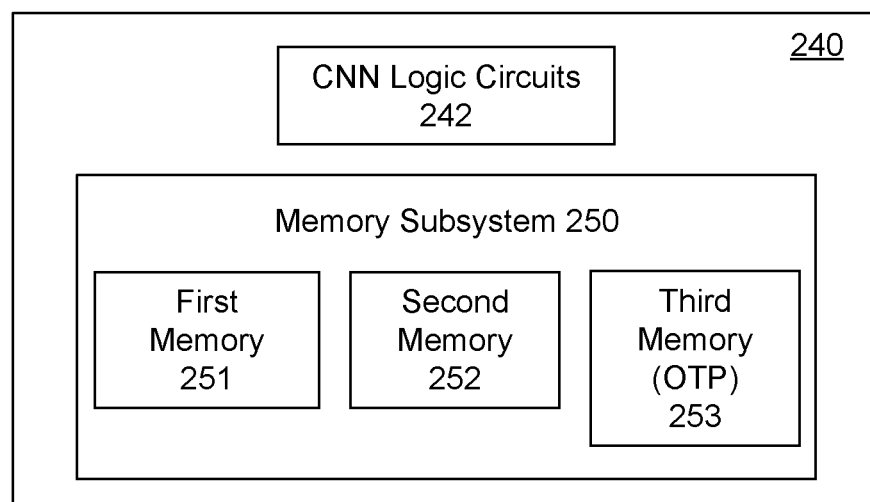
FIG. 2C is a function block diagram showing yet another example CNN processing unit including a third example memory subsystem according to an embodiment of the invention.

A further embodiment shown in FIG. 2C, a CNN processing unit 240 comprises CNN logic circuits 242 operatively coupling to a memory subsystem 250. Memory subsystem 250 contains first memory 251, second memory 252 and third memory 253. The first memory 251 is for storing filter coefficients and the second memory 252 is for storing imagery data substantially similar to the CNN processing unit 200 of FIG. 2A. The third memory 253 is a one-time-programming (OTP) memory that can be used for other purposes (e.g., a unique pattern for security).

In one embodiment, all three memories 251-253 are made of MRAM cells with VCMA based MTJ elements. In another embodiment, the second memory 252 is made of SRAM cells instead of MRAM cells.

OTP is referred to data being written to memory only one time (e.g., substantially permanent once written). For a MRAM cell, OTP can be performed in many stages: wafer level, chip level, after soldering during fabrication of a CNN based digital IC. For example, a specific application such as face recognition requires a particular set of filter coefficients, which can be permanently written to an IC (i.e., first memory 232 in FIG. 2B) during fabrication. Or a specific usage (e.g., security for certain application or user), the data is permanently written to an IC (i.e., third memory 253 in FIG. 2C).

OTP can also be performed after fabrication during use, for example, a specific pattern unique to any application and any user is created and programmed (i.e., written) to the OTP memory in an initialization procedure or at first use. In one embodiment, one user can write a particular set of filter coefficients to an IC (i.e., first memory 232 in FIG. 2B) for one type of applications, while another user can write a different set of filter coefficients for another type of applications. In another embodiment, a unique pattern of data (e.g., user data such as user identification, name, number, fingerprint, etc.) can be written to an IC (i.e., third memory 253 in FIG. 2C) during use for security or other purposes.

To break down the oxide barrier layer of a VCMA based MTJ element for creating OTP memory, several techniques can be used:
(a) applying an electric voltage higher than normal read/write voltage (a range of 100-700 mV (milli-volts)) during fabrication or use;
(b) applying an electric current longer than normal read/write time or duty cycle of 5 ns (nanoseconds) during fabrication or use; and
(c) setting different size of VCMA based MTJ elements (bits) in a range of 20×60-150×450 nm for in-plane and 20-150 nm in diameter for out-of-plane VCMA based MTJ element during fabrication, the smaller size is easier for respective oxide barrier layers to be broken down.

Furthermore, the aforementioned techniques can be used alone or in any combinations, for example, (a) and (c), (a) and (b), or (b) and (c).

Although the invention has been described with reference to specific embodiments thereof, these embodiments are merely illustrative, and not restrictive of, the invention. Various modifications or changes to the specifically disclosed exemplary embodiments will be suggested to persons skilled in the art. For example, whereas image processing has been shown and described as an example usage of the CNN based digital IC, other applications may be used, for example, voice recognition. Sound waves can be recorded and converted into a series of digital images (e.g., using fast Fourier Transform), whose features in turn can be extracted using a CNN based digital IC. Furthermore, two groups of different sized MTJ elements have been shown and described for the at least two groups, any number of groups of different sized MTJ elements may be used for achieving the same, for example, three groups. Additionally, the order of the layers in example VCMA based MTJ elements has been shown and described in one particular pattern, other patterns may be used for achieving the same, for example, the order of the fixed layer and the free layer can be reversed. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A digital integrated circuit for artificial intelligence comprising:
    a semi-conductor substrate embedded in a single semi-conductor chip, the semi-conductor substrate containing a plurality of cellular neural networks (CNN) processing units, each CNN processing unit comprising:
    CNN logic circuits; and
    an embedded memory subsystem operatively coupled to the CNN logic circuits;
    the embedded memory subsystem further comprising:
    a first memory for storing a set of weights; and
    a second memory for storing input signals that require higher endurance of balanced data read and write operations than the first memory.

2. The digital integrated circuit of claim 1, wherein the first memory contains a first plurality of magnetic random access memory (MRAM) cells with each of the first plurality of MRAM cells containing a first in-plane voltage-controlled magnetic anisotropy (VCMA) based magnetic tunnel junction (MTJ) element.

3. The digital integrated circuit of claim 2, wherein the first in-plane VCMA based MTJ element comprises an elliptical planar shape having a range of 40-120 nm in minor-dimension and 120-360 nm in major-dimension.

4. The digital integrated circuit of claim 2, wherein the second memory contains a second plurality of magnetic random access memory (MRAM) cells with each of the second plurality of MRAM cells containing a second in-plane voltage-controlled magnetic anisotropy (VCMA) based magnetic tunnel junction (MTJ) element.

5. The digital integrated circuit of claim 4, wherein the second in-plane VCMA based MTJ element comprises an elliptical planar shape having a range of 30-80 nm in minor-dimension and 90-240 nm in major-dimension.

6. The digital integrated circuit of claim 2, wherein the second memory contains a plurality of static random access memory (SRAM) cells.

7. The digital integrated circuit of claim 1, wherein the first memory contains a first plurality of magnetic random access memory (MRAM) cells with each of the first plurality of MRAM cells containing a first out-of-plane voltage-controlled magnetic anisotropy (VCMA) based magnetic tunnel junction (MTJ) element.

8. The digital integrated circuit of claim 7, wherein the first out-of-plane VCMA based MTJ element comprises a circular planar shape having a range of 40-120 nm in diameter.

9. The digital integrated circuit of claim 7, wherein the second memory contains a second plurality of magnetic random access memory (MRAM) cells with each of the second plurality of MRAM cells containing a second out-of-plane voltage-controlled magnetic anisotropy (VCMA) based magnetic tunnel junction (MTJ) element.

10. The digital integrated circuit of claim 9, wherein the second out-of-plane VCMA based MTJ element comprises a circular planar shape having a range of 30-80 nm in diameter.

11. The digital integrated circuit of claim 7, wherein the second memory contains a plurality of static random access memory (SRAM) cells.

12. A digital integrated circuit for artificial intelligence comprising:
    a semi-conductor substrate embedded in a single semi-conductor chip, the semi-conductor substrate containing a plurality of cellular neural networks (CNN) processing units, each CNN processing unit comprising:
    CNN logic circuits; and
    an embedded memory subsystem operatively coupled to the CNN logic circuits;
    the embedded memory subsystem further comprising:
    a first memory for storing a set of one-time-programming weights; and
    a second memory for storing input signals that require higher endurance of balanced data read and write operations than the first memory.

13. The digital integrated circuit of claim 12, wherein the first memory contains a first plurality of magnetic random access memory (MRAM) cells with each of the first plurality of MRAM cells containing a first voltage-controlled magnetic anisotropy (VCMA) based magnetic tunnel junction (MTJ) element and the second memory contains a second plurality of MRAM cells with each of the second plurality of MRAM cells containing a second voltage-controlled magnetic anisotropy (VCMA) based MTJ element.

14. The digital integrated circuit of claim 13, wherein each of the first and the second VCMA based MTJ elements comprises an elliptical planar shape with in-plane magnetization.

15. The digital integrated circuit of claim 13, wherein each of the first and the second VCMA based MTJ elements comprises a circular planar shape with out-of-plane magnetization.

16. The digital integrated circuit of claim 12, wherein the first memory contains a plurality of magnetic random access memory (MRAM) cells with each of the plurality of MRAM cells containing a voltage-controlled magnetic anisotropy (VCMA) based magnetic tunnel junction (MTJ) element and the second memory contains a plurality of static random access memory (SRAM) cells.

17. A digital integrated circuit for artificial intelligence comprising:
- a semi-conductor substrate in a single semi-conductor chip, the semi-conductor substrate containing a plurality of cellular neural networks (CNN) processing units, each CNN processing unit comprising:
  CNN logic circuits; and
  an embedded memory subsystem operatively coupled to the CNN logic circuits;
  the embedded memory subsystem further comprising:
    a first memory for storing a set of weights;
    a second memory for storing input signals that require higher endurance of balanced data read and write operations than the first memory; and
    a third memory for storing a one-time-programming unique data pattern written thereon for security purpose.

18. The digital integrated circuit of claim 17, wherein the first memory contains a first plurality of magnetic random access memory (MRAM) cells with each of the first plurality of MRAM cells containing a first voltage-controlled magnetic anisotropy (VCMA) based magnetic tunnel junction (MTJ) element, the second memory contains a second plurality of MRAM cells with each of the second plurality of MRAM cells containing a second voltage-controlled magnetic anisotropy (VCMA) based MTJ element, and the third memory contains a third plurality of MRAM cells with each of the third plurality of MRAM cells containing a third voltage-controlled magnetic anisotropy (VCMA) based MTJ element.

19. The digital integrated circuit of claim 17, wherein the first memory contains a first plurality of magnetic random access memory (MRAM) cells with each of the first plurality of MRAM cells containing a first voltage-controlled magnetic anisotropy (VCMA) based magnetic tunnel junction (MTJ) element, the second memory contains a plurality of static random access memory (SRAM) cells, and the third memory contains a second plurality of MRAM cells with each of the second plurality of MRAM cells containing a second voltage-controlled magnetic anisotropy (VCMA) based MTJ element.

20. The digital integrated circuit of claim 17, wherein the semi-conductor substrate comprises a silicon chip.

* * * * *